(12) United States Patent
Kim et al.

(10) Patent No.: US 9,202,990 B2
(45) Date of Patent: Dec. 1, 2015

(54) LIGHT EMITTING DIODE PACKAGE AND BACKLIGHT UNIT INCLUDING THE SAME

(71) Applicant: Samsung Display Co., Ltd., Yongin, Gyeonggi-Do (KR)

(72) Inventors: Kyung Min Kim, Hwaseong-si (KR); Byung Seo Yoon, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/282,735

(22) Filed: May 20, 2014

(65) Prior Publication Data

US 2015/0221831 A1 Aug. 6, 2015

(30) Foreign Application Priority Data

Feb. 4, 2014 (KR) .................. 10-2014-0012655

(51) Int. Cl.
| | |
|---|---|
| *H01L 33/00* | (2010.01) |
| *H01L 33/48* | (2010.01) |
| *H01L 33/60* | (2010.01) |
| *H01L 33/62* | (2010.01) |
| *H01L 33/56* | (2010.01) |
| *G02F 1/1335* | (2006.01) |
| *H01L 33/50* | (2010.01) |
| *H01L 33/52* | (2010.01) |

(52) U.S. Cl.
CPC ........ *H01L 33/486* (2013.01); *G02F 1/133603* (2013.01); *H01L 33/56* (2013.01); *H01L 33/60* (2013.01); *H01L 33/62* (2013.01); *H01L 33/502* (2013.01); *H01L 33/52* (2013.01); *H01L 2224/48091* (2013.01); *H01L 2224/73265* (2013.01); *H01L 2933/0083* (2013.01); *H01L 2933/0091* (2013.01)

(58) Field of Classification Search
CPC ......... H01L 33/60; H01L 33/62; H01L 33/56; H01L 33/486
See application file for complete search history.

(56) References Cited

U.S. PATENT DOCUMENTS

| | | | |
|---|---|---|---|
| 7,334,907 B2 | 2/2008 | Nagayama | |
| 8,182,112 B2 | 5/2012 | Shaikevitch et al. | |
| 2001/0022390 A1* | 9/2001 | Waitl et al. | 257/666 |
| 2012/0018772 A1* | 1/2012 | Nishijima et al. | 257/99 |
| 2012/0228660 A1* | 9/2012 | Lee et al. | 257/98 |
| 2012/0250326 A1* | 10/2012 | Sekine | 362/249.08 |
| 2012/0286220 A1* | 11/2012 | Takasu et al. | 252/582 |
| 2013/0214418 A1* | 8/2013 | Yang | 257/762 |
| 2015/0108510 A1* | 4/2015 | Urano et al. | 257/88 |

FOREIGN PATENT DOCUMENTS

| | | |
|---|---|---|
| JP | 2009-046326 A | 3/2009 |
| JP | 2012-104538 A | 5/2012 |
| JP | 2013-183067 A | 9/2013 |
| KR | 1020090002026 A | 1/2009 |

(Continued)

*Primary Examiner* — Ngan Ngo
(74) *Attorney, Agent, or Firm* — Innovation Counsel LLP

(57) ABSTRACT

Provided are a light emitting diode package and a backlight assembly including the light emitting diode package. The light emitting diode package may comprise a package main body including a cavity; a light emitting diode (LED) chip positioned in the cavity; a lead frame installed in the package main body, positioned in the cavity at least partly, electrically connected to the light emitting diode chip mounted on the lead frame, and having one surface having a diffusion reflective layer thereon.

16 Claims, 12 Drawing Sheets

(56) References Cited

FOREIGN PATENT DOCUMENTS

| KR | 1020130021301 A | 3/2013 |
| KR | 1020130027709 A | 3/2013 |
| KR | 1020130029990 A | 3/2013 |
| KR | 1020130051095 A | 5/2013 |
| KR | 1020130077965 A | 7/2013 |

* cited by examiner

LIGHT EMITTING DIODE PACKAGE AND BACKLIGHT UNIT INCLUDING THE SAME

CROSS-REFERENCE TO RELATED APPLICATIONS

This application is based on and claims priority from Korean Patent Application No. 10-2014-0012655, filed on Feb. 4, 2014 in the Korean Intellectual Property Office, the disclosure of which is incorporated herein in its entirety by reference.

BACKGROUND

1. Field

The present application relates to a light emitting diode package that is used in a backlight unit of a liquid crystal display.

2. Description of the Prior Art

In general, since a liquid crystal display has advantages of thin thickness, light weight, and low power consumption, it is used in a monitor, a notebook computer, a cellular phone, and a large-scale TV. The liquid crystal display includes a liquid crystal display panel that displays an image using light permeability of liquid crystals and a backlight assembly arranged on a lower portion of the liquid crystal display panel to provide light to the liquid crystal panel.

The backlight assembly includes light sources that generate light required to display an image on the liquid crystal display panel. For example, the light sources may be a cold cathode fluorescent lamp (CCFL), an external electrode fluorescent lamp (EEFL), a flat fluorescent lamp (FFL), and a light emitting diode (LED).

Recently, a light emitting diode which has low power consumption and environment-friendly characteristics has been widely used.

A light emitting diode may be used as a light source of a liquid crystal display in the form of a light emitting diode package. The light emitting diode package may be of a type in which a light emitting diode chip is built in a package main body and the package main body is attached to a substrate, or of a COB (Chip On Board) type in which a light emitting diode chip is directly attached to a substrate.

The light emitting diode chip may be a red light emitting diode chip, a green light emitting diode chip, or a blue light emitting diode chip. A light emitting diode module may include a red light emitting diode chip, a green light emitting diode chip, and a blue light emitting diode chip, and may mix light provided from the plurality of light emitting diode chips to output white light.

The light emitting diode chips have light distribution in the form of a point light source, and the light in the form of a point light source is changed to light distribution in the form of a surface light source in a specific region by a dedicated lens.

SUMMARY

One embodiment provides a light emitting diode package which can improve color separation that is generated in the light emitting diode package and a backlight unit including the same.

However, embodiments are not restricted to the one set forth herein. The above and other embodiments will become more apparent to one of ordinary skill in the art by referencing the detailed description of the embodiments given below.

In one aspect of the inventive concept, there may be provided a light emitting diode package, comprising: a package main body including a cavity; a light emitting diode (LED) chip positioned in the cavity; a lead frame installed in the package main body, positioned in the cavity at least partly, electrically connected to the light emitting diode chip mounted on the lead frame, and having one surface having a diffusion reflective layer thereon.

The light emitting diode package may further comprise a protection resin that fills in the cavity to protect the light emitting diode chip.

The protection resin may comprise at least one phosphor selected from the group including garnets, silicates, sulfides, oxynitrides, nitrides, and aluminates.

The diffusion reflective layer may comprise light diffuser particles composed of one selected from the group including silicon resin, polyacrylate, polyurethane, polyethylene, polypropylene, nylon, polystyrene, polymethylmethacrylate, polycarbonate, $CaCO_3$, $BaSO_4$, silica, $TiO_2$, alumina, $CeO_2$, ZnO, talc, mica, and a mixture thereof.

The diffusion reflective layer may be in a region that overlaps the cavity.

In another aspect of the inventive concept, there may be provided a light emitting diode package, comprising: a package main body including a cavity; a light emitting diode (LED) chip positioned in the cavity; and a lead frame. The lead frame is installed in the package main body, positioned in the cavity at least partly, electrically connected to the light emitting diode chip mounted on the lead frame, and has one surface having a mirror reflective layer thereon. The mirror reflective layer has a diffusion reflective pattern thereon.

The light emitting diode package may further comprise a protection resin that fills in the cavity to protect the light emitting diode chip.

The protection resin may comprise at least one phosphor selected from the group including garnets, silicates, sulfides, oxynitrides, nitrides, and aluminates.

The mirror reflective layer may be a silver (Ag)-plated layer.

The diffusion reflective pattern may comprise light diffuser particles composed of one selected from the group including silicon resin, polyacrylate, polyurethane, polyethylene, polypropylene, nylon, polystyrene, polymethylmethacrylate, polycarbonate. $CaCO_3$, $BaSO_4$, silica, $TiO_2$, alumina, $CeO_2$, ZnO, talc, mica, and a mixture thereof.

The diffusion reflective pattern may be in a region that overlaps the cavity.

The diffusion reflective pattern may be a dot pattern.

The dot pattern may be one selected from the group including a matrix type, a radial type, and a circular type.

In one aspect of the inventive concept, there may be provided a light emitting diode package, comprising: a printed circuit board including an insulating board, a circuit pattern printed on the insulating board, a diffusion reflective pattern on the circuit pattern, and a light emitting diode chip mounted on the diffusion reflective pattern and electrically connected to the printed circuit board.

In another aspect of the inventive concept, there may be provided a light emitting diode package comprising: a printed circuit board including an insulating board, a circuit pattern printed on the insulating board, a mirror reflective layer on the circuit pattern, a diffusion reflective pattern on the mirror reflective layer, and a light emitting diode chip mounted on the diffusion reflective pattern and electrically connected to the printed circuit board.

The mirror reflective layer may be a silver (Ag)-plated layer.

The diffusion reflective pattern may comprise light diffuser particles composed of one selected from the group including silicon resin, polyacrylate, polyurethane, polyethylene, polypropylene, nylon, polystyrene, polymethylmethacrylate, polycarbonate, $CaCO_3$, $BaSO_4$, silica, $TiO_2$, alumina, $CeO_2$, ZnO, talc, mica, and a mixture thereof.

The diffusion reflective pattern may be a dot pattern.

The dot pattern may be one selected from the group including a matrix type, a radial type, and a circular type.

According to the embodiments, at least the following effects can be achieved.

It is possible to provide the light emitting diode package that can improve color mixing in the light emitting diode package and the backlight unit including the same.

The effects according to the inventive concept are not limited to the contents as exemplified above, but further various effects are included in the description.

BRIEF DESCRIPTION OF THE DRAWINGS

The above and other features of the inventive concept will be more apparent from the following detailed description taken in conjunction with the accompanying drawings, in which.

DETAILED DESCRIPTION OF THE EMBODIMENTS

Figure 1:
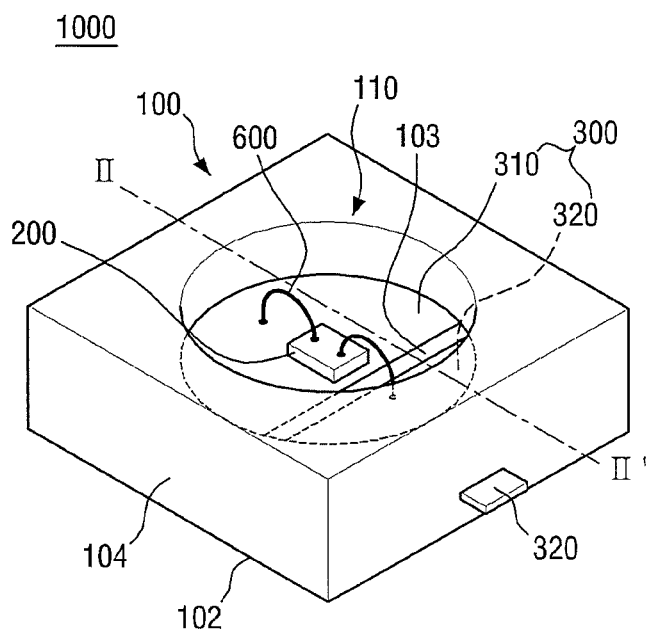
FIG. 1 is a perspective view of a light emitting diode package according to a first embodiment.

Features of the inventive concept and methods of accomplishing the same may be understood more readily by reference to the following detailed description of preferred embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims.

In the drawings, the thickness of layers and regions are exaggerated for clarity. As used herein, the term "and/or" includes any and all combinations of one or more of the associated listed items.

Hereinafter, embodiments will be described with reference to the accompanying drawings.

Figure 2:
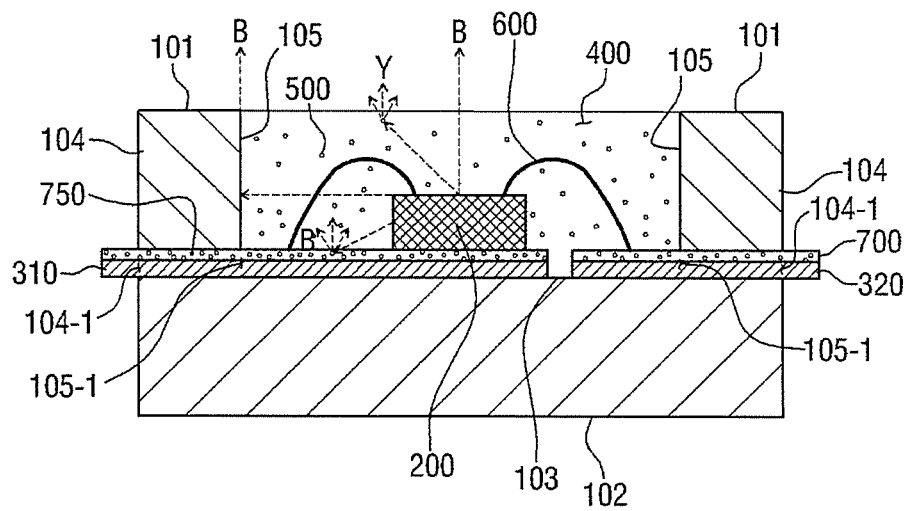
FIG. 2 is a cross-sectional view taken along line II-II' of FIG. 1.

FIG. 1 is a perspective view of a light emitting diode package 1000 according to a first embodiment, and FIG. 2 is a cross-sectional view taken along line II-II' of FIG. 1. To help understanding, light that is emitted from a light emitting diode chip is indicated by an arrow in FIG. 2.

Referring to FIGS. 1 and 2, a light emitting diode package 1000 may include a package main body 100, a light emitting diode chip 200, a lead frame 300, a protection resin 400, a phosphor 500, and wires 600.

The package main body 100 may support the light emitting diode chip 200 and the lead frame 300. The package main body 100 may be formed using polymer resin that can be easily injected, and such polymer resin may be, for example, PPA (Polyphthal Amide) or LCP (Liquid Crystal Polymer), which has superior thermal deformation at high temperature.

The package main body 100 is not limited to the above-described material, but may be made of various materials. For example, the package main body 100 may be made of one of silicon, strained silicon, a silicon alloy, SOI (Silicon-On-Insulator), silicon carbide (SiC), silicon germanium (SiGe), silicon germanium carbide (SiGeC), germanium, a germanium alloy, gallium arsenide (GaAs), indium arsenide (InAs), aluminum nitride (AlN), ceramic, a combination thereof, and a laminate thereof.

The package main body 100 may include a cavity 110 that is a space in which the light emitting diode chip 200 is mounted. The package main body 100 may include a first surface 101 of an upper portion thereof, a second surface 103 of an intermediate portion thereof, a second surface 102 of a lower portion thereof, and side walls 104 and 105. The outer side wall 104 may be bent to extend from a corner of the second surface 102 of the lower portion toward the first surface 101 of the upper portion. The first surface 101 may be bent to extend from a corner of the outer side wall 104 to the inside. The inner side wall 105 may be bent to extend from the corner of the first surface 101 to the second surface 103 of the intermediate portion. The inner side wall 105 may be bent and extend to form the second surface 103, i.e., the second surface 103 may be bent to extend from the inner side wall 105. The first surface 101, the second surface 102, the second surface 103, the inner side wall 105, and the outer side wall 104 may form a single closed curve.

The cavity 110 may be formed by the hollow type first surface 101 and the inner side wall 105 that is bent to extend from the corner of the first surface 101 to the second surface 103 of the intermediate portion.

A first through-hole 105-1 and a second through-hole 104-1 may be formed on parts of the inner side wall 105 and the outer side wall 104. The first through-hole 105-1 and the second through-hole 104-1 may communicate with each other. The first through-hole 105-1 and the second through-hole 104-1 may be a space in which a first lead frame 310 and a second lead frame 320 are mounted. The cavity 110, the first through-hole 105-1 and the second through-hole 104-1 may communicate with each other.

The package main body 100 may be in a cylindrical shape or polygonal prism shape. The polygonal prism shape may be, for example, a rectangular prism, a triangular prism, or a hexagonal prism.

The cavity 110 may be in the form of a circle, an ellipse, or a polygon.

FIG. 1 illustrates a hollow cylindrical package main body 100 in which a circular cavity 110 is formed.

The light emitting diode chip 200 may be a light source using an optical semiconductor that converts electrical energy into light energy. The light emitting diode chip 200 may have a heterostructure of p-type semiconductor and n-type semiconductor. Although not illustrated, the light emitting diode chip 200 may include a first conduction type (e.g., p-type) first conduction layer, a second conduction type (e.g., n-type) second conductive layer, a light emitting layer arranged between the first conduction type and the second conduction type, a first chip electrode (positive electrode) connected to the first conductive layer, and a second chip electrode (negative electrode) connected to the second conductive layer.

If a forward driving bias is applied to the light emitting diode chip 200, carriers (i.e., holes) of the first conductive layer and carriers (i.e., electrons) of the second conductive layer meet and are bonded together to generate light in the light emitting layer. The first conductive layer, the second conductive layer, and the light emitting layer may be made of $In_xAl_yGa_{(1-x-y)}N$ ($0 \leq x \leq 1$, $0 \leq y \leq 1$), but are not limited thereto.

The light emitting diode chip 200 may be operated by a driving bias that is applied between the first conductive layer and the second conductive layer. An absolute value of a difference between a first bias that is applied to the first conductive layer and a second bias that is applied to the second conductive layer corresponds to the driving bias. The first bias may be transferred to the first conductive layer through the first lead frame 310 and the first chip electrode (not illustrated), and the second bias may be transferred to the second conductive layer through the second lead frame 320 and the second chip electrode (not illustrated). Here, the driving bias may be a DC power, but is not limited thereto.

The light emitting diode chip 200 is positioned in the cavity 110 to emit light to an outside.

The lead frame 300 may include the first lead frame 310 and the second lead frame 320. The first lead frame 310 and the second lead frame 320 may be separated from each other. The first lead frame 310 and the second lead frame 320 may be electrically connected to the first chip electrode and the second chip electrode of the light emitting diode chip 200, respectively. The electrical connection between the first lead frame 310 and the first chip electrode and the electrical connection between the second lead frame 320 and the second chip electrode may be performed using, for example, wires 600.

The wire 600 may be a metal that electrically connect the light emitting diode chip 200 and the lead frame 300 to each other. Specifically, the wire may be made of gold (Au).

Parts of the first lead frame 310 and the second lead frame 320 may be positioned in the cavity 110.

The first lead frame 310 and the second lead frame 320 may be supported by the second surface 103, and the first lead frame 310 may be exposed to an outside through the first through-hole 105-1 and the second through-hole 104-1. A first lead frame terminal of the first lead frame 310 that is exposed to an outside may be electrically connected to the printed circuit board. The second lead frame 320 may be exposed to an outside through the first through-hole 105-1 and the second through-hole 104-1. A second lead frame terminal of the second lead frame 320 that is exposed to the outside may be electrically connected to the printed circuit board.

The first lead frame 310 and the second lead frame 320 may be made of a conductive metal. For example, the first lead frame 310 and the second lead frame 320 may be made of copper, but are not limited thereto.

A diffusion reflective layer 700 may be formed on surfaces of the first lead frame 310 and the second lead frame 320. The diffusion reflective layer 700 may be formed only one surface of each of the first lead frame 310 and the second lead frame 320. The one surface of each of the first lead frame 310 and the second lead frame 320 may be a region on which the light emitting diode chip 200 is mounted.

The light emitting diode chip 200 may be mounted on the diffusion reflective layer 700 of the one surface of the first lead frame 310 or the second lead frame 320. The light emitting diode chip 200 may be attached to the diffusion reflective layer 700 in a die bonding method. The light emitting diode chip 200 may be mounted on the diffusion reflective layer 700 using epoxy resin or silicon resin.

The diffusion reflective layer 700 may change a path of light that is emitted from a side surface of the light emitting diode chip 200 to the side of the first surface 101. The diffusion reflective layer 700 may be formed on a region that overlaps the cavity 110. The overlapping region may be a partial region of the second surface 103 having the same area as the area of the cavity 110 on plane.

The diffusion reflective layer 700 may include light diffuser particles 750. The light diffuser particles 750 may be in the range of micrometers. For example, the light diffuser particles 750 may be equal to or larger than 1 μm and smaller than 1000 μm.

The light diffuser particles 750 may be added to a resin material, such as epoxy resin or silicon resin, and may be spread onto the first lead frame 310 and the second lead frame 320 in a paste state. The path of the light that is emitted from the side surface of the light emitting diode chip 200 may be changed to the side of the first surface 101 after the light collides with the light diffuser particles 750.

The light diffuser particles 750 may be organic light diffuser particles. Specifically, the organic particles may be homopolymer, such as silicon resin (having refractive index of 1.43), polyacrylate (having refractive index of 1.49), polyurethane (having refractive index of 1.51), polyethylene (having refractive index of 1.54), polypropylene (having refractive index of 1.46), nylon (having refractive index of 1.54), polystyrene (having refractive index of 1.59), polymethylmethacrylate (having refractive index of 1.49), or polycarbonate (having refractive index of 1.59), or copolymer of their monomers.

The light diffuser particles 750 may be inorganic light diffuser particles. Specifically, the inorganic particles may be inorganic light diffuser, such as silica (having refractive index of 1.47), alumina (having refractive index of 1.50 to 1.56), glass (having refractive index of 1.51), $CaCO_3$ (having refractive index of 1.51), talc (having refractive index of 1.56), mica (having refractive index of 1.56), $BaSO_4$ (having refractive index of 1.63), ZnO (having refractive index of 2.03), $CeO_2$ (having refractive index of 2.15), $TiO_2$ (having refractive index of 2.50 to 2.71), or iron oxide (having refractive index of 2.90), or a mixture thereof.

A protection resin 400, which protects the light emitting diode chip 200 and transmits light to emit the light to an outside, may fill in the cavity 110. The protection resin 400 may be a light permeable material and a material having superior adhesion to the package main body 100, for example, resin, such as epoxy resin, silicon resin, hard silicon resin, modified silicon resin, urethane resin, oxetane resin, acryl resin, polycarbonate resin, or polyimide resin, but is not limited thereto. The silicon resin may have strong durability against blue light or UV light, and the characteristic that is strong against heat or moisture as compared with the epoxy resin.

The protection resin 400 may fill the cavity 110 with the same height as the package main body 100, but is not limited thereto. The protection resin 400 may fill the cavity 110 with a height that is higher than the height of the package main body 100, and may project in a semi-sphere shape based on the first surface 101.

The protection resin 400 may include phosphor 500. The phosphor 500 may absorb the light that is emitted from the light emitting diode chip 200 and convert the light into light having a different wavelength. That is, the phosphor 500 may be a material which absorbs the light through primary light emission of the light emitting diode chip 200 and secondarily emits light.

Using the phosphor 500, the light emitting device can show various colors, and in order to express white color, the following method may be used.

If the light emitting diode chip 200 emits blue light (light having blue wavelengths) (this light emitting diode chip 200 is called a blue light emitting device), the phosphor 500 may be yellow phosphor that generates yellow light through conversion of a wavelength of a part of the blue light and red phosphor that generates red light through conversion of a wavelength of a part of the blue light. Further, the phosphor 500 may be green phosphor that generates green light through conversion of a wavelength of a part of the blue light and red phosphor that generates red light through conversion of a wavelength of a part of the blue light. That is, if the light emitting diode chip 200 is a blue light emitting device, it emits white light in a manner that the light primarily emitted by the light emitting diode chip 200 and the light secondarily emitted by the phosphor 500 are mixed together.

On the other hand, if the light emitting diode chip 200 emits light having a UV wavelength (this light emitting diode chip 200 is called a UV light emitting device), the phosphor 500 may include red phosphor, green phosphor, and blue phosphor (i.e., RGB).

The phosphor 500 may be garnets, silicates, sulfides, oxynitrides, nitrides, or aluminates. Specifically, the phosphor 500 may be at least one selected from nitride/oxynitride phosphor mainly activated by lanthanoid element, such as Eu or Ce, alkaline earth halogen apatite phosphor mainly activated by lanthanoid element such as Eu or transition metal element such as Mn, alkaline earth metal boric acid halogen phosphor, alkaline earth metal aluminate phosphor, rare earth aluminate mainly activated by alkaline earth silicate, alkaline earth emulsion, alkaline earth thio-gallate, alkaline earth silicon nitride, germanide or lanthanoid element such as Ce, and organic and organic complex mainly activated by rare earth silicate or lanthanoid element such as Eu, but is not limited thereto.

Referring to FIG. 2, light paths in the light emitting diode package according to the first embodiment will be described.

As described above, the protection resin 400 may fill in the cavity 110 of the package main body 100. The protection resin 400 may include the phosphor 500. The phosphor may be yellow phosphor. The light emitting diode chip 200 may be arranged on the first lead frame 310 in the cavity 110. The light emitting diode chip 200 may be mounted on the diffusion reflective layer 700 of the first lead frame 310. The light emitting diode chip 200 may be a blue light emitting diode chip.

The blue light may be emitted from the blue light emitting diode chip 200 to the sides of the first surface 101 of the package main body 100 and the side walls 104 and 105.

Most blue light B may be emitted to the outside of the package main body 100 through the cavity 110 as it is without color change. A part of the blue light that is emitted from the blue light emitting diode chip 200 to the side wall side may collide with the yellow phosphor 500 to be converted into yellow light Y, and may be emitted to the outside of the package main body 100 through the cavity 110. Another part of the blue light that is emitted from the blue light emitting diode chip 200 to the side wall side may reach up to the inner side wall 105 of the package main body 100 without colliding with the yellow phosphor 500, and may be emitted to the outside of the package main body 100 through the cavity 110 on the side of the first surface 101 along the inner side wall 105. Still another part of the blue light B that is emitted from the blue light emitting diode chip 200 to the sides of the side walls 104 and 105 may collide with the light diffuser particles 750 and may be emitted to the outside of the package main body 100 through the cavity 110 on the side of the first surface 101.

According to the existing light emitting diode package, the blue light B that is emitted from the side surface of the light emitting diode chip 200 is regularly reflected by a mirror reflective layer, travels up to the inner side wall 105, and then is emitted to the side of the first surface 101 along the inner side wall 105. Accordingly, there is not blue light B that is emitted from a region between the light emitting diode chip 200 and the inner side wall 105 to the side of the first surface 101, and the boundary between the blue light B and the yellow light Y is distinct.

According to the light emitting diode package according to the first embodiment, the diffusion reflective layer 700 is arranged in the region between the light emitting diode chip 200 and the inner side wall 105, and thus the blue light B can be emitted even from the region to the side of the first surface 101. Through this, color mixing of the blue light and the yellow light may be increased, and as a result, the boundary between the blue light B and the yellow light Y can be mitigated.

Figure 3:
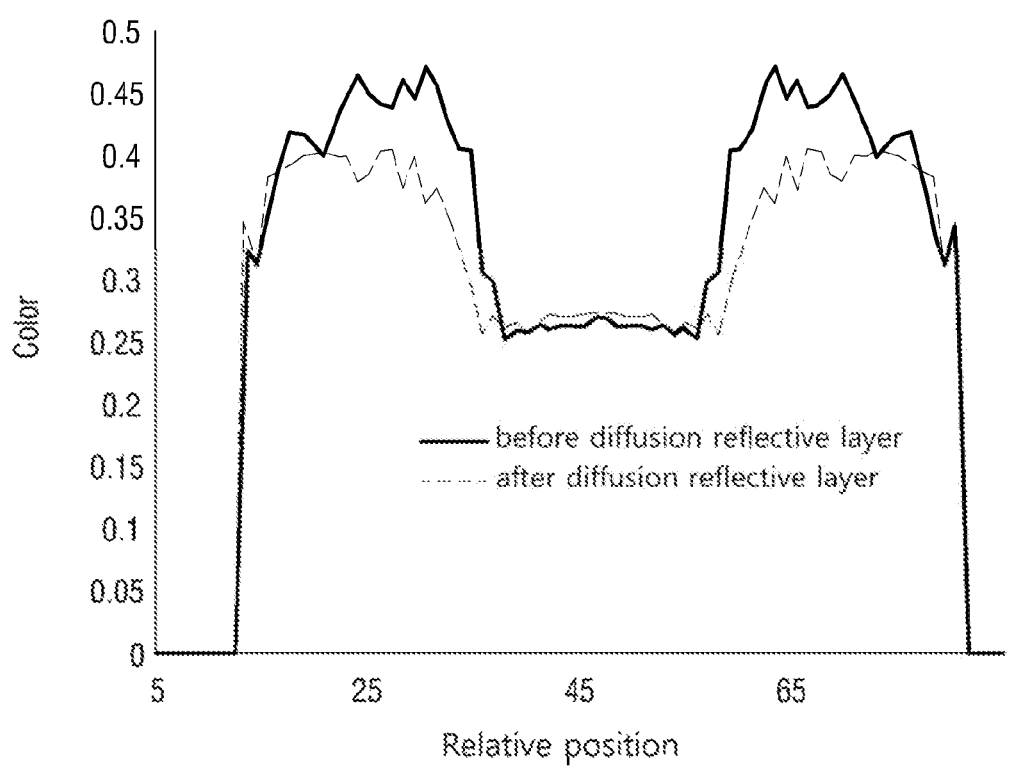
FIG. 3 is a color profile graph obtained by experiments using a light emitting diode package according to a first embodiment.

FIG. 3 is a color profile graph obtained by experiments using a light emitting diode package 1000 according to a first embodiment. Referring to FIG. 3, it can be confirmed that the numerical values on the vertical axis have been changed before and after the diffusion reflective layer 700 is formed in a C region on the left and right sides of an A region of the relative positions of about 35 to 55 on the horizontal axis.

Specifically, the numerical values of the vertical axis (color) are reduced after the diffusion reflective layer 700 is formed rather than before the diffusion reflective layer 700 is formed. This means that the color mixing of the yellow color Y and the blue color B is improved in the C region after the diffusion reflective layer 700 is formed.

Figure 4:
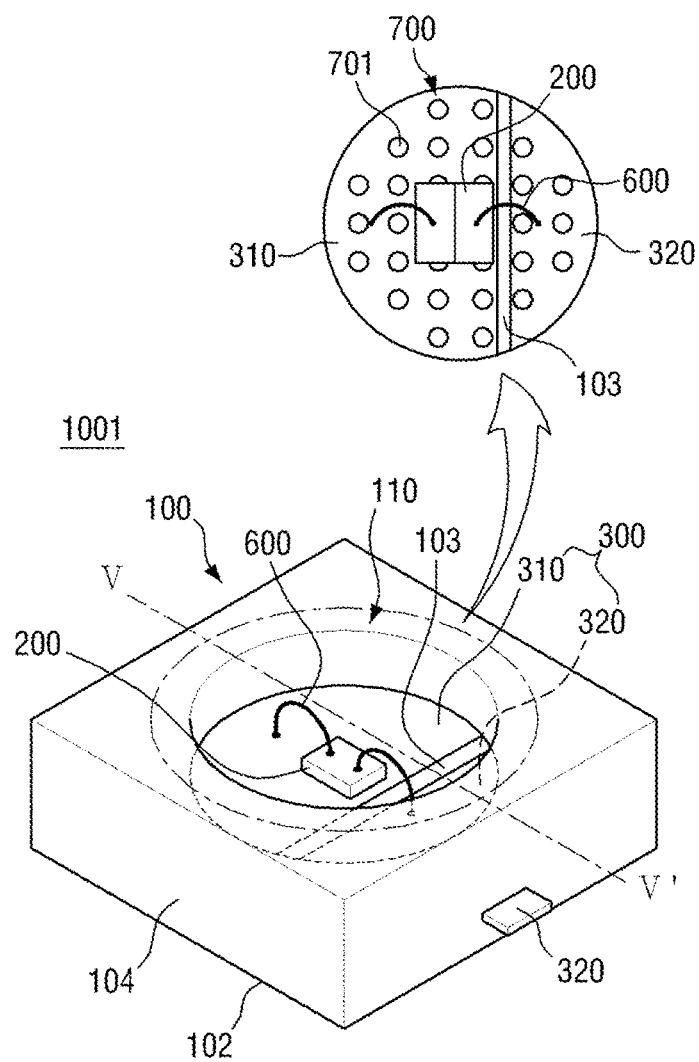
FIG. 4 is a perspective view of a light emitting diode package according to a second embodiment.
Figure 5:
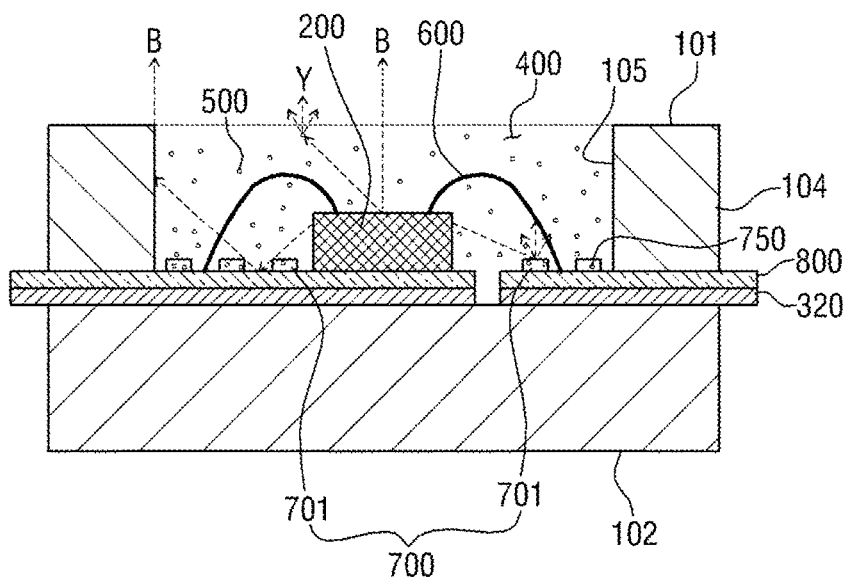
FIG. 5 is a cross-sectional view taken along line V-V' of FIG. 4.

FIG. 4 is a perspective view of a light emitting diode package 1001 according to a second embodiment, and FIG. 5 is a cross-sectional view of the light emitting diode package 1001 according to the second embodiment, taken along line V-V' of FIG. 4. To help understanding, the light that is emitted from the light emitting diode chip 200 is indicated by an arrow.

The second embodiment of FIGS. 4 and 5 is different from the first embodiment of FIGS. 1 and 2 on the point that a mirror reflective layer 800 is formed on a lead frame 300 and a diffusion reflective pattern 700 is formed on the mirror reflective layer 800.

For convenience in explanation, the same reference numeral 700 is used for the diffusion reflective layer and the diffusion reflective pattern.

Referring to FIGS. 4 and 5, the mirror reflective layer 800 may be a silver (Ag) plated layer to show high reflectivity characteristics.

The diffusion reflective pattern 700 may be a dot pattern. That is, a plurality of dots 701 may be arranged on the mirror reflective layer 800. The dots 701 may be printed on the mirror reflective layer 800 in the form of a paste that is made by adding the light diffuser particles 750 to epoxy resin or silicon resin. Specifically, the dots 701 may be printed by screen printing or inkjet printing. The dots 701 may include the light diffuser particles 750.

The dot pattern may be in the form of a matrix in which 28 dots 701 are arranged in rows and columns to be spaced apart from each other at a predetermined interval. The matrix may be in the form in which the dots arranged in rows and columns are arranged on the same straight line.

In the first row, two dots 701 may be arranged to be spaced apart from each other at a predetermined interval. In the second row, four dots 701 may be arranged to be spaced apart from each other at a predetermined interval. In the third row, six dots 701 may be arranged to be spaced apart from each other at a predetermined interval. In the fourth row, four dots 701 may be arranged to be spaced apart from each other at a predetermined interval. In the fifth row, six dots 701 may be arranged to be spaced apart from each other at a predetermined interval. In the sixth row, four dots 701 may be arranged to be spaced apart from each other at a predetermined interval. In the seventh row, two dots 701 may be arranged to be spaced apart from each other at a predetermined interval.

In the first column, three dots 701 may be arranged to be spaced apart from each other at a predetermined interval. In the second column, five dots 701 may be arranged to be spaced apart from each other at a predetermined interval. In the third and fourth columns, six dots 701 may be arranged to be spaced apart from each other at a predetermined interval. In the fifth column, five dots 701 may be arranged to be spaced apart from each other at a predetermined interval. In the sixth column, three dots 701 may be arranged to be spaced apart from each other at a predetermined interval. However, the numbers of dots in the rows and columns are not limited thereto.

The density of the plurality of dots 701 that constitute the dot pattern can be adjusted according to the regions in which the light that is emitted from the light emitting diode chip 200 collides with the phosphor 500 and the light having the changed color is distributed.

Referring to FIG. 5, light paths in the light emitting diode package 1001 according to the second embodiment will be described.

The second embodiment is different from the first embodiment of FIG. 2 on the point that the diffusion reflective pattern 700 is partially formed on the mirror reflective layer 800.

Referring to FIG. 5, the light that is emitted from the light emitting diode chip 200 may collide with the dots 701, may be diffusion-reflected, and then may be emitted to the side of the first surface 101 through the cavity 110. Regarding others, the explanation of the light paths according to the first embodiment of FIG. 2 may be referred to.

Figure 6:
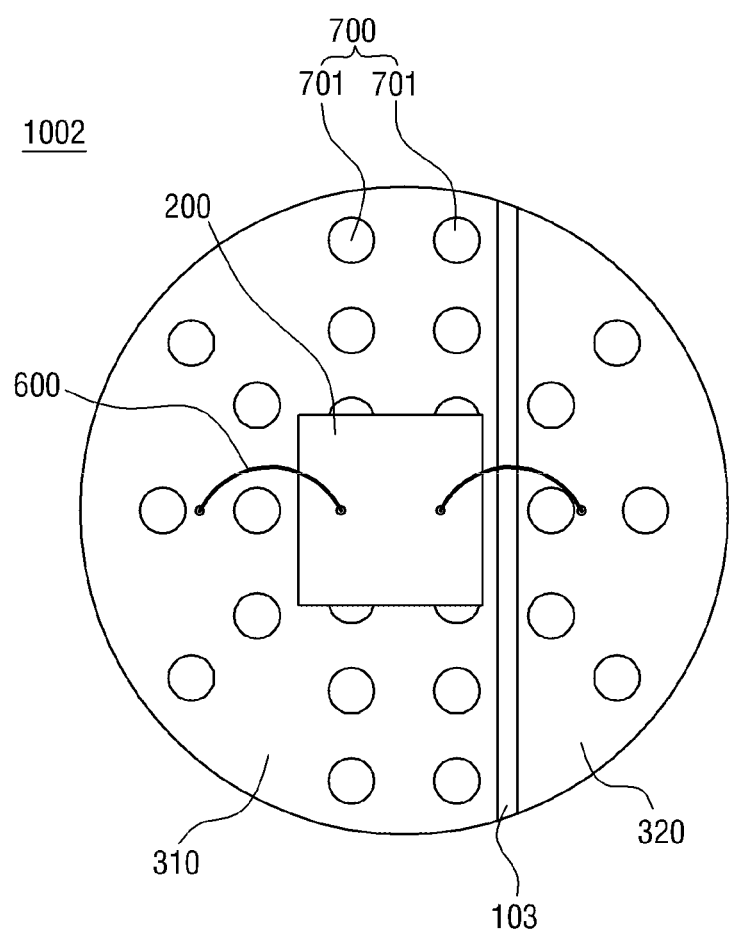
FIG. 6 is a plan view of a light emitting diode package according to a third embodiment.

FIG. 6 is a plan view of a light emitting diode package 1002 according to a third embodiment.

Referring to FIG. 6, the third embodiment is different from the second embodiment of FIG. 4 on the point that the dot pattern is a radial pattern. 24 dots 701 may be radially arranged around the light emitting diode chip 200. The radial pattern may be in the form that the dots arranged on the same straight line around the light emitting diode chip 200 are spread in every direction.

Six dots 701 on the upper portion of the light emitting diode chip 200 may be symmetrical with six dots 701 on the lower portion of the light emitting diode chip 200. The six dots 701 on the upper portion of the light emitting diode chip 200 may be arranged in rows and columns at a predetermined interval. The six dots 701 on the lower portion of the light emitting diode chip 200 may be arranged in rows and columns at a predetermined interval to be symmetrical with the six dots 701 on the upper portion of the light emitting diode chip 200.

The six dots 701 on the left portion of the light emitting diode chip 200 may be symmetrical with the six dots 701 on the right portion of the light emitting diode chip 200.

The six dots 701 on the left portion of the light emitting diode chip 200 may be arranged in a fan shape. The gap distance between three dots 701 that are far apart from the light emitting diode chip 200 may be relatively larger than the gap distance between three dots 701 that are close to each other.

Three outermost dots 701 may be arranged in a fan shape so that 6 dots 701 on the right portion of the light emitting diode chip 200 are symmetrical with 6 dots 701 on the left portion of the light emitting diode chip 200.

Figure 7:
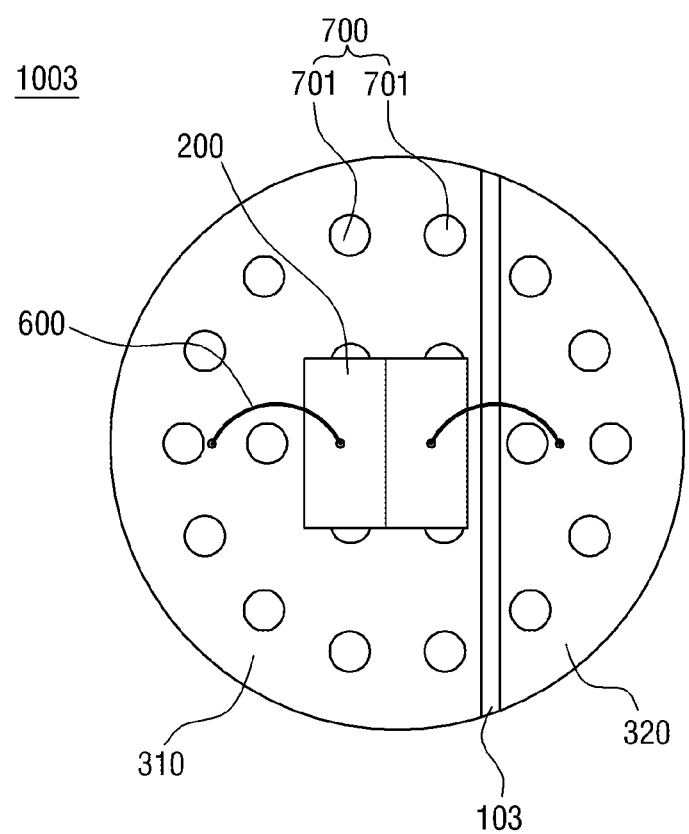
FIG. 7 is a plan view of a light emitting diode package according to a fourth embodiment.

FIG. 7 is a plan view of a light emitting diode package 1003 according to a fourth embodiment.

Referring to FIG. 7, the fourth embodiment is different from the second embodiment of FIG. 4 on the point that the dot pattern is a circular pattern. Fourteen dots 701 among twenty dots 701 may be circularly arranged at an equal interval.

Six dots 701 may be arranged in the neighborhood of the light emitting diode chip 200 in a manner that two of them are arranged on the upper portion of the light emitting diode chip 200, two of them are arranged on the lower portion thereof, one of them is arranged on the left portion thereof, and one of them is arranged on the right portion thereof.

The two dots 701 on the upper portion of the light emitting diode chip 200 and the two dots 701 on the lower portion of the light emitting diode chip 200 are symmetrical with each other about the light emitting diode chip 200. The one dot 701 on the left portion of the light emitting diode chip 200 and the one dot 701 on the right portion of the light emitting diode chip 200 are symmetrical with each other about the light emitting diode chip 200.

The distance between the two dots 701 on the upper portion of the light emitting diode chip 200 and the two dots 701, which are arranged on the same line as the two dots 701 on the upper portion of the light emitting diode chip 200, among the fourteen dots 701 circularly arranged may be longer than the distance between the one dot 701 on the left portion of the light emitting diode chip 200 and the one dot 701, which is arranged on the same line as the one dot 701 on the left portion of the light emitting diode chip 200, among the fourteen dots 701 circularly arranged.

The six dots 701 in the vicinity of the light emitting diode chip 200 may be circularly arranged about the light emitting diode chip 200.

Figure 8:
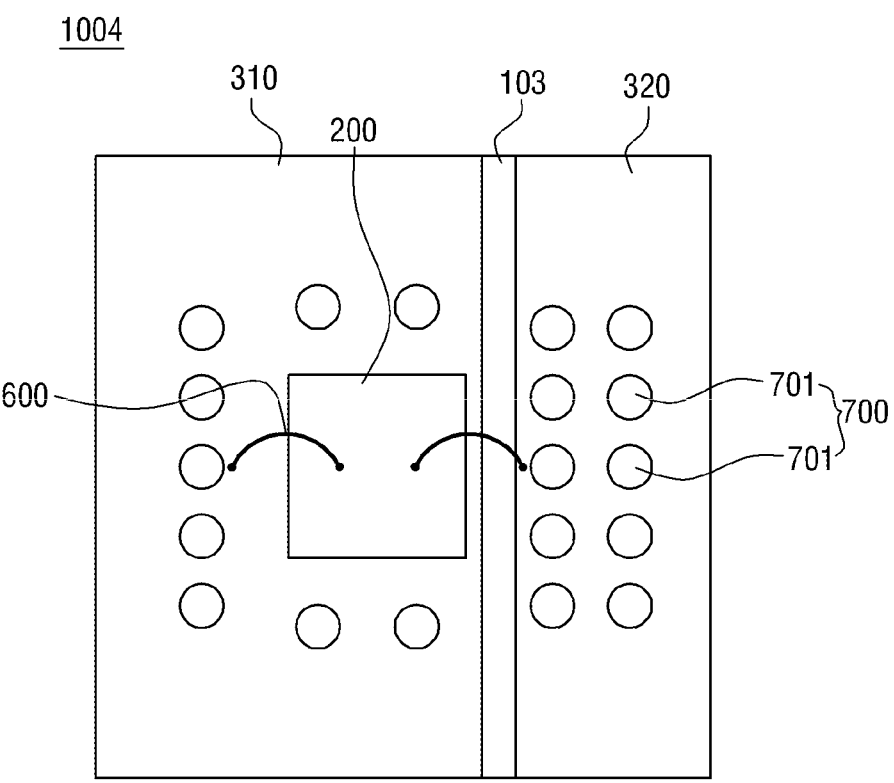
FIG. 8 is a plan view of a light emitting diode package according to a fifth embodiment.

FIG. 8 is a plan view of a light emitting diode package 1004 according to a fifth embodiment.

Referring to FIG. 8, the fifth embodiment is different from the second embodiment of FIG. 4 on the point that the cavity 110 is in a rectangular shape. Further, the fifth embodiment is different from the second embodiment of FIG. 4 on the point that the density of the dots 701 becomes higher as the dots 701 are closer to the light emitting diode chip 200. That is, the density of the dots 701 may be low in a place that is far from the light emitting diode chip 200. In the total area of the first lead frame 310, a region where the dots 701 are arranged may be a region that is a short distance away from the light emitting diode chip 200.

Further, the dots 701 may be asymmetrically arranged about the light emitting diode chip 200. Specifically, five dots 701 may be arranged in the first column of the left portion of the light emitting diode chip 200, and five dots 701 may be respectively arranged in the third and fourth columns of the right portion of the light emitting diode chip 200.

Figure 9:
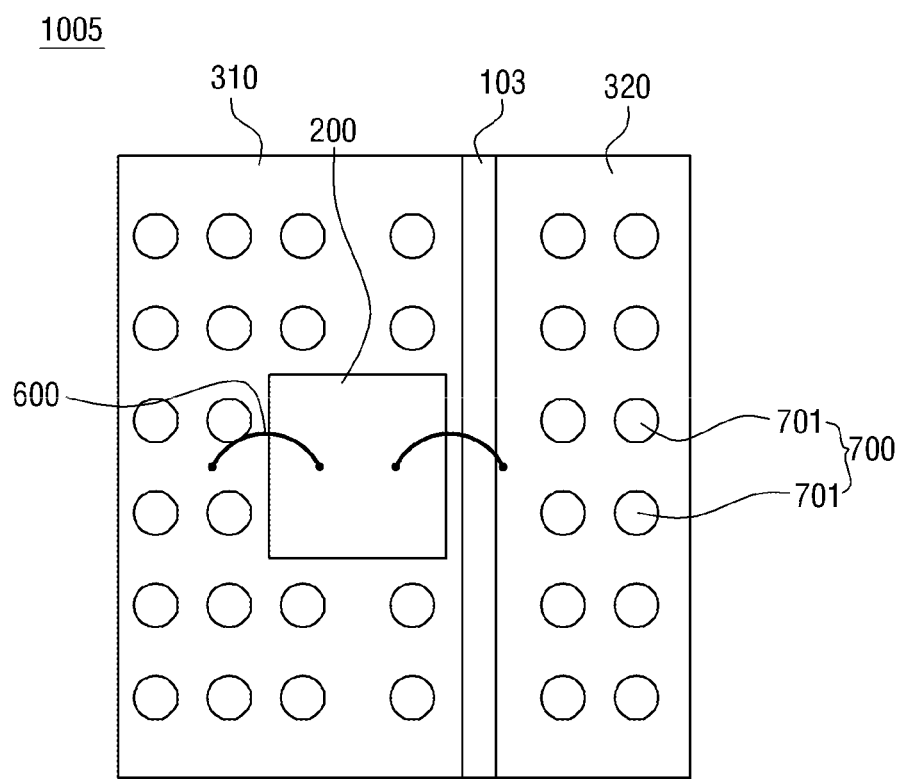
FIG. 9 is a plan view of a light emitting diode package according to a sixth embodiment.

FIG. 9 is a plan view of a light emitting diode package 1005 according to a sixth embodiment.

Referring to FIG. 9, the sixth embodiment is different from the second embodiment of FIG. 4 on the point that the cavity 110 is in a rectangular shape. 28 dots 701 may be arranged in rows and columns at a predetermined interval. That is, the 28 dots 701 may be arranged in the form of a matrix. The 28 dots 701 may be symmetrically arranged about the light emitting diode chip 200 in rows and columns.

Figure 10:
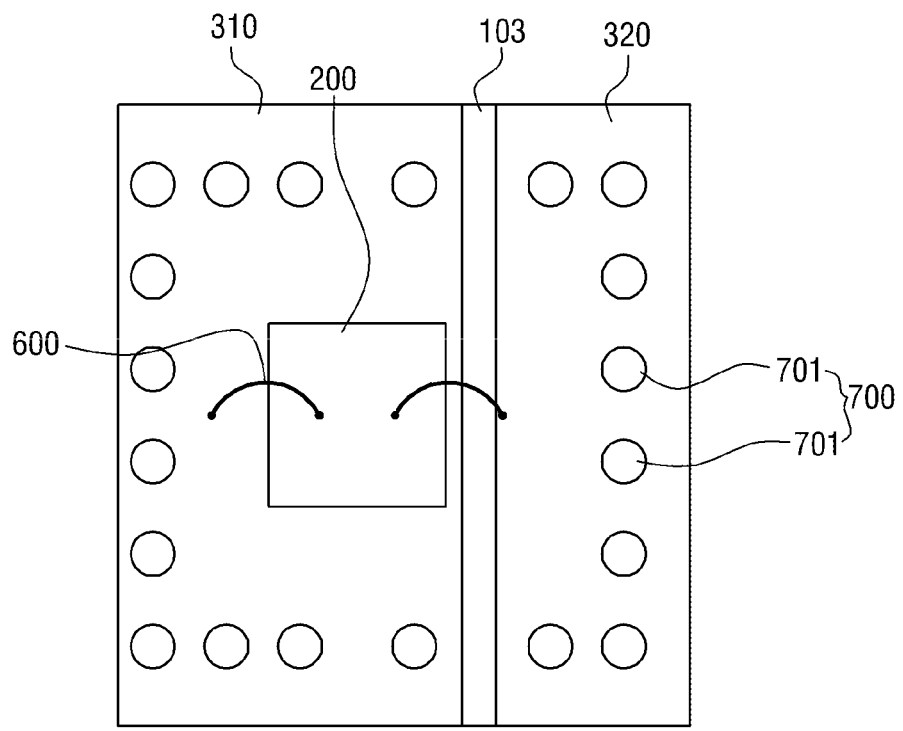
FIG. 10 is a plan view of a light emitting diode package according to a seventh embodiment.

FIG. 10 is a plan view of a light emitting diode package 1006 according to a seventh embodiment.

Referring to FIG. 10, the seventh embodiment is different from the fifth embodiment of FIG. 8 on the point that the density of the dots 701 becomes higher as the dots 701 are far away from the light emitting diode chip 200. In the total area of the first lead frame 310, a region where the dots 701 are arranged may be a region that is a long distance away from the light emitting diode chip 200.

The twenty dots 701 may be arranged in rows and columns at a predetermined interval. The twenty dots 701 may be symmetrical about the light emitting diode chip 200 along the rows and columns.

Figure 11:
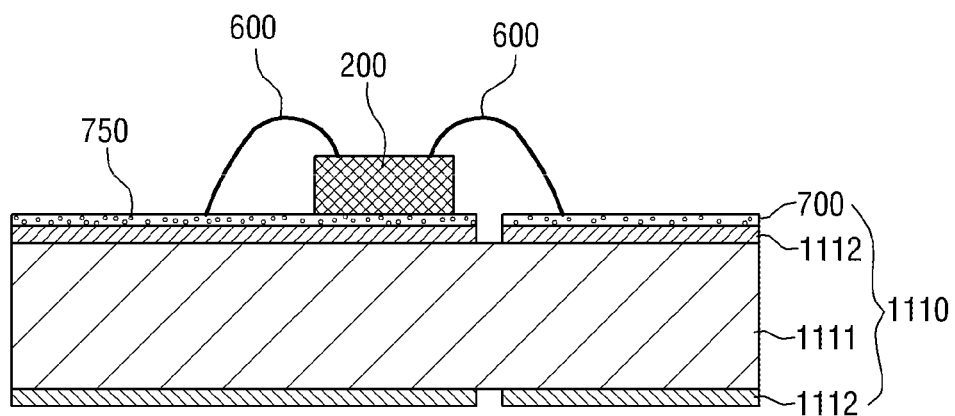
FIG. 11 is a cross-section view of a light emitting diode package according to an eighth embodiment.

FIG. 11 is a cross-section view of a light emitting diode package 1100 according to an eighth embodiment.

Referring to FIG. 11, the eighth embodiment is different from the first embodiment of FIG. 1 on the point that the light emitting diode package 1100 is of a COB (Chip On Board) type. The COB type light emitting diode package 1100 may include a printed circuit board 1110 and a light emitting diode chip 200 electrically connected to the printed circuit board 1110. The printed circuit board 1110 may include an insulating board 1111, a circuit pattern 1112 formed on the insulating board 1111, and a diffusion reflective layer 700 formed on at least one surface of the circuit pattern 1112. The light emitting diode chip 200 may be die-bonded on the diffusion reflective layer 700. The light emitting diode chip 200 and the circuit pattern 1112 may be electrically connected to each other using wires 600.

Figure 12:
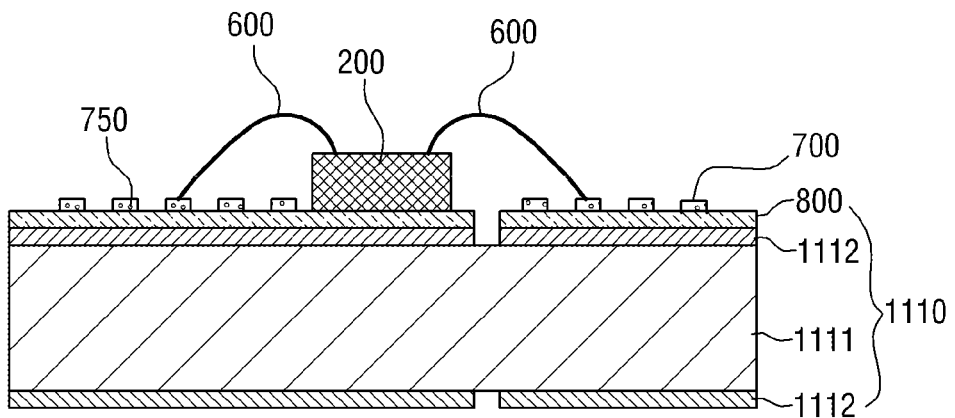
FIG. 12 is a cross-section view of a light emitting diode package according to a ninth embodiment.

FIG. 12 is a cross-sectional view of a light emitting diode package 1200 according to a ninth embodiment.

Referring to FIG. 12, the ninth embodiment is different from the embodiment of FIG. 11 on the point that a mirror reflective layer 800 is formed on the circuit pattern 1112 and a diffusion reflective pattern 700 is formed on the mirror reflective layer 800. Regarding the mirror reflective layer 800 and the diffusion reflective pattern 700, the above-described contents may be referred to.

Figure 13:
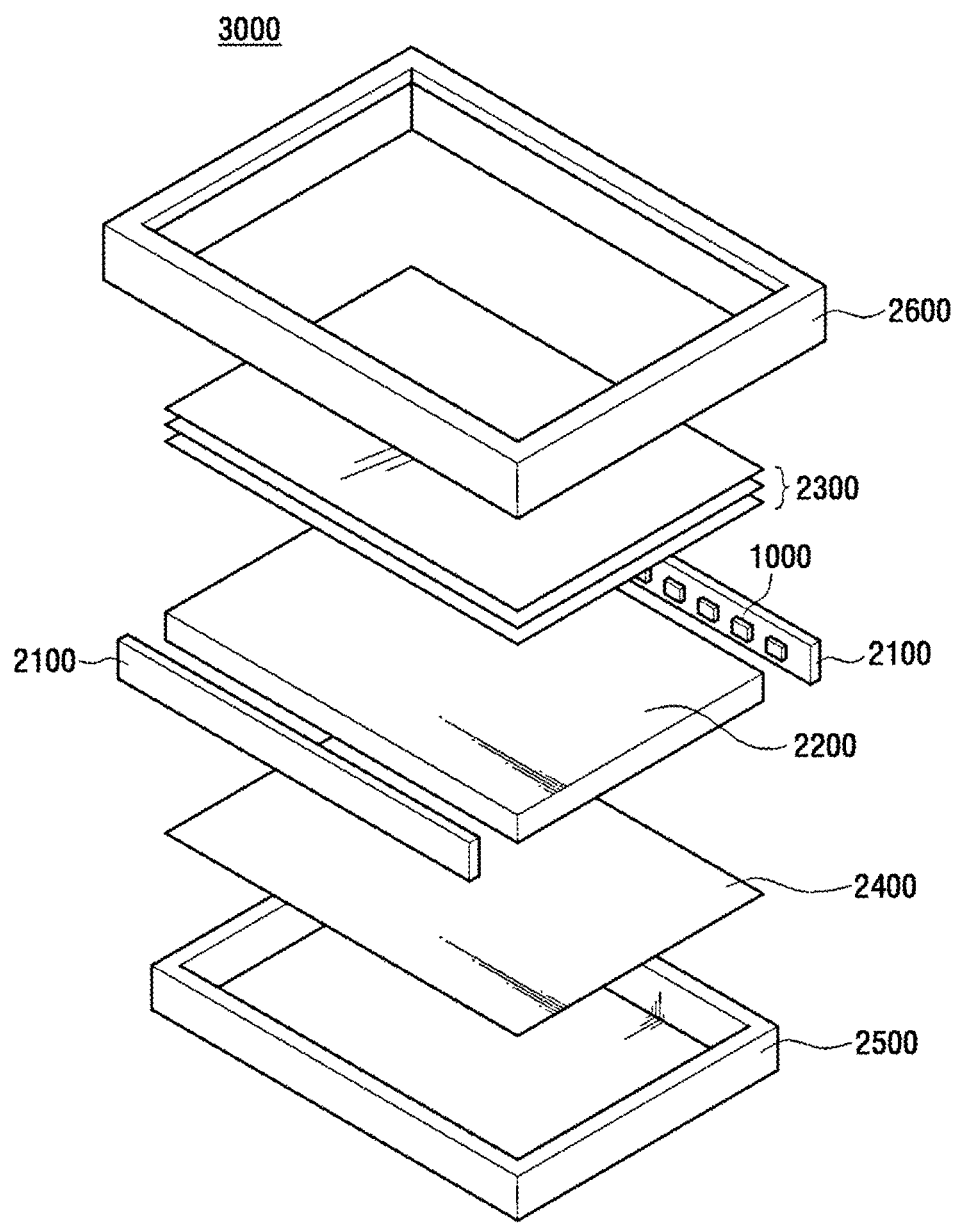
FIG. 13 is an exploded perspective view of a backlight unit according to a first embodiment.

FIG. 13 is an exploded perspective view of a backlight assembly 3000 according to a first embodiment.

Referring to FIG. 13, the backlight assembly 3000 according to the first embodiment may include a light emitting diode package 1000 aligned on an alignment plate 2100, a light guide panel 2200, an optical sheet 2300, a reflective sheet 2400, a first container 2500, and a second container 2600.

The alignment plate 2100 may have a length that corresponds to a long side of the backlight assembly 3000, and may be arranged on one side or both sides of the long side of the backlight assembly 3000. A plurality of light emitting diode packages 1000 may be connected to each other and arranged on the alignment plate 2100, and electrode terminals (not illustrated) of the light emitting diode packages 1000 may be connected to a power applying device (not illustrated) of the alignment plate 2100. Light emitting diode chips (not illustrated) that emit red, green, and blue light may be mounted in the light emitting diode packages 1000, and red light, green light, and blue light, which are emitted from the light emitting diode chips may be mixed to emit white light.

The light guide panel 2200 may be in a flat plate shape and serve to guide incident light. The alignment plate 2100 is arranged in parallel to one side or both sides of the light guide panel 2200, and the white light may be emitted from the light emitting diode packages 1000 aligned on the alignment plate 2100 to the light guide panel 2200.

The light guide panel 2200 may be made of a material having light permeability, for example, acryl resin such as PMMA (PolyMethylMethAcrylate) or a material having constant refractive index, such as PC (PolyCarbonate), so as to effectively guide the light.

The optical sheet 2300 may be arranged on the upper portion of the light guide panel 2200 to diffuse and collect the light that is transferred from the light guide panel 2200. The optical sheet 2300 may include a diffusion sheet, a first prism sheet, and a second prism sheet.

The reflective sheet 2400 may be arranged on the lower portion of the light guide panel 2200, and may have a reflective surface that reflects the light that is emitted to the lower portion of the light guide panel 2200 to an upper portion thereof.

The first container 2500 may be in a rectangular shape, and side walls are formed along the corners thereof to form a space, in which the alignment plate 2100 that includes the light emitting diode package 1000, the light guide panel 2200, the optical sheet 2300, and the reflective sheet 2400 are accommodated.

The second container 2600 may include side walls formed along the rectangular corners to protect the optical sheet 2300 and the light guide panel 2200. The second container 2600 may have a structure in which an open window is formed on the upper portion thereof to visually recognize the light that is emitted from the light emitting diode package 1000.

The second container 2600 is fastened to the first container 2500 to complete the backlight assembly 3000.

Figure 14:
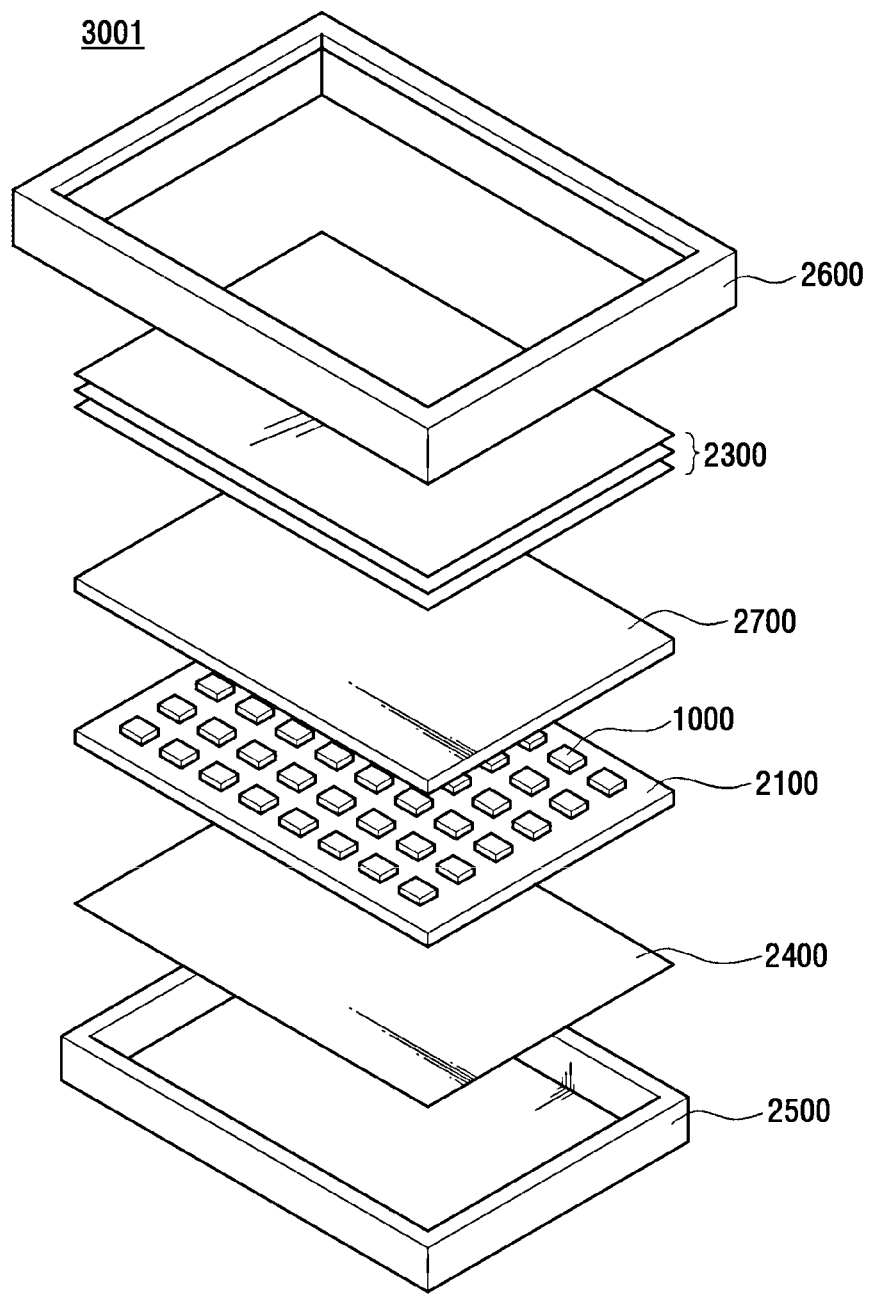
FIG. 14 is an exploded perspective view of a backlight unit according to a second embodiment.

FIG. 14 is an exploded perspective view of a backlight assembly 3001 according to a second embodiment.

Referring to FIG. 14, the backlight assembly 3001 according to the second embodiment may be of a direct type in which light sources are arranged on a bottom surface of a first container 2500. In this embodiment, light emitting diode packages 1000 may be used as the light sources.

The backlight assembly 3001 according to the second embodiment includes a diffusion plate 2700, and an alignment plate 2100 that includes the light emitting diode packages 1000 may be arranged on the bottom surface of the first container 2500.

The alignment plate 2100 according to this embodiment may have a size that corresponds to the diffusion plate 2700 and a liquid crystal panel (not illustrated). The alignment plate 2100 according to this embodiment is arranged on the bottom surface of the first container 2500.

A plurality of light emitting diode packages 1000 may be arranged on one surface of the alignment plate 2100 at an equal interval in the horizontal and vertical directions to form a surface light source.

The diffusion plate 2700 may be arranged on the alignment plate 2100 on which the light emitting diode packages 1000 are arranged. The diffusion plate 2700 serves to improve the luminance uniformity of the light that is emitted from the light emitting diode packages 1000.

A reflective sheet 2400 may be arranged on the other surface of the alignment plate 2100 on which the light emitting diode packages 1000 are mounted.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting diode package comprising:
a package main body including a cavity;
a light emitting diode (LED) chip positioned in the cavity;
a lead frame installed in the package main body, positioned in the cavity at least partly, electrically connected to the light emitting diode chip mounted on the lead frame, and having one surface having a diffusion reflective layer thereon, wherein the diffusion reflective layer comprises light diffuser particles composed of one selected from group including silicon resin, polyacrylate, polyurethane, polyethylene, polypropylene, nylon, polystyrene, polymethylmethacrylate, polycarbonate, $CaCO_3$, $BaSO_4$, silica, $TiO_2$, alumina, $CeO_2$, ZnO, talc, mica, and a mixture thereof.

2. The light emitting diode package of claim 1, further comprising a protection resin that fills in the cavity to protect the light emitting diode chip.

3. The light emitting diode package of claim 2, wherein the protection resin comprises at least one phosphor selected from the group including garnets, silicates, sulfides, oxynitrides, nitrides, and aluminates.

4. The light emitting diode package of claim 1, wherein the diffusion reflective layer is in a region that overlaps the cavity.

5. A light emitting diode package comprising:
a package main body including a cavity;
a light emitting diode (LED) chip positioned in the cavity;
a lead frame installed in the package main body, positioned in the cavity at least partly, electrically connected to the light emitting diode chip mounted on the lead frame, and having one surface having a mirror reflective layer thereon, the mirror reflective layer having a diffusion reflective pattern thereon, wherein the diffusion reflective pattern is a dot pattern.

6. The light emitting diode package of claim 5, further comprising a protection resin that fills in the cavity to protect the light emitting diode chip.

7. The light emitting diode package of claim 6, wherein the protection resin comprises at least one phosphor selected from the group including garnets, silicates, sulfides, oxynitrides, nitrides, and aluminates.

8. The light emitting diode package of claim 5, wherein the mirror reflective layer is a silver (Ag)-plated layer.

9. The light emitting diode package of claim 5, wherein the diffusion reflective pattern comprises light diffuser particles composed of one selected from the group including silicon resin, polyacrylate, polyurethane, polyethylene, polypropylene, nylon, polystyrene, polymethylmethacrylate, polycarbonate, $CaCO_3$, $BaSO_4$, silica, $TiO_2$, alumina, $CeO_2$, ZnO, talc, mica, and a mixture thereof.

10. The light emitting diode package of claim 5, wherein the diffusion reflective pattern is in a region that overlaps the cavity.

11. The light emitting diode package of claim 5, wherein the dot pattern is one selected from the group including a matrix type, a radial type, and a circular type.

12. A light emitting diode package comprising:
a printed circuit board including an insulating board, a circuit pattern printed on the insulating board, and a diffusion reflective layer on the circuit pattern, wherein the diffusion reflective layer comprises light diffuser particles composed of one selected from the group including silicon resin polyacrylate, polyurethane, polyethylene, polypropylene, nylon, polystyrene, polymethylmethacrylate, polycarbonate, $CaCO_3$, $BaSO_4$, silica, $TiO_2$, alumina, $CeO_2$, ZnO, talc, mica and a mixture thereof; and
a light emitting diode chip mounted on the diffusion reflective layer and electrically connected to the printed circuit board.

13. A light emitting diode package comprising:
a printed circuit board including an insulating board, a circuit pattern printed on the insulating board, a mirror reflective layer on the circuit pattern, and a diffusion reflective pattern on the mirror reflective layer, wherein the diffusion reflective pattern is a dot pattern; and
a light emitting diode chip mounted on the diffusion reflective pattern and electrically connected to the printed circuit board.

14. The light emitting diode package of claim 13, wherein the mirror reflective layer is a silver (Ag)-plated layer.

15. The light emitting diode package of claim 13, wherein the diffusion reflective pattern comprises light diffuser particles composed of one selected from the group including silicon resin, polyacrylate, polyurethane, polyethylene, polypropylene, nylon, polystyrene, polymethylmethacrylate, polycarbonate, $CaCO_3$, $BaSO_4$, silica, $TiO_2$, alumina, $CeO_2$, ZnO, talc, mica, and a mixture thereof.

16. The light emitting diode package of claim 13, wherein the dot pattern is one selected from the group including a matrix type, a radial type, and a circular type.

* * * * *